(12) United States Patent
Yang et al.

(10) Patent No.: US 12,106,884 B2
(45) Date of Patent: Oct. 1, 2024

(54) RADIO FREQUENCY AUTO-TRANSFORMER, RADIO FREQUENCY DEVICE AND METHOD OF CONSTRUCTION OF AN AUTO-TRANSFORMER

(71) Applicant: NXP B.V., Eindhoven (NL)

(72) Inventors: Xin Yang, Houten (NL); Mark Pieter van der Heijden, Eindhoven (NL)

(73) Assignee: NXP B.V., Eindhoven (NL)

( * ) Notice: Subject to any disclaimer, the term of this patent is extended or adjusted under 35 U.S.C. 154(b) by 327 days.

(21) Appl. No.: 17/651,868

(22) Filed: Feb. 21, 2022

(65) Prior Publication Data

US 2022/0285081 A1 Sep. 8, 2022

(30) Foreign Application Priority Data

Mar. 5, 2021 (EP) .................................... 21161087

(51) Int. Cl.
H01F 27/28 (2006.01)
H01F 41/04 (2006.01)
H03H 7/00 (2006.01)

(52) U.S. Cl.
CPC ....... *H01F 27/2804* (2013.01); *H01F 41/041* (2013.01); *H03H 7/00* (2013.01); *H01F 2027/2809* (2013.01)

(58) Field of Classification Search
CPC ........ H03H 7/38; H03H 7/00; H01F 27/2804; H01F 27/28; H01F 2027/2809; H01F 2027/2819; H01F 41/041; H01F 30/02; H01F 30/06; H01F 30/08
See application file for complete search history.

(56) References Cited

U.S. PATENT DOCUMENTS

| 9,087,838 B2 | 7/2015 | Yen et al. |
| 9,634,614 B2 | 4/2017 | Mu |
| 2019/0334489 A1 | 10/2019 | Hamidian et al. |

FOREIGN PATENT DOCUMENTS

| EP | 2669907 A1 | 12/2013 |
| WO | 0145254 A1 | 6/2001 |

*Primary Examiner* — Stephen E. Jones

(57) ABSTRACT

A radio frequency, RF, auto-transformer circuit (300, 700, 901) and method (1000) of constructing a RF auto-transformer are described. The RF, auto-transformer circuit (300, 700, 901) includes: an inner coil formed (1102) with a first metal layer (MT1) to create a first shunt inductor (302), wherein at least a portion of the inner coil is overlayed (1106) with a second metal layer (MT2) that creates a first series inductor (303) that exhibits inductive coupling to the first shunt inductor (302). An outer coil is formed (1104) with the first metal layer (MT1) that creates a second series inductor (304), where the outer coil is located adjacent the inner coil and provides inductive coupling between the second series inductor (304) and each of the first shunt inductor (302) and first series inductor (303). At least a portion of the outer coil is overlayed (1008) with the second metal layer (MT2) that creates a second shunt inductor (301) that exhibits inductive coupling between the second shunt inductor (301) and each of the first shunt inductor (302) and first series inductor (303) and second series inductor (304). The outer coil is connected (1112) to the inner coil using vias and the respective first metal layer (MT1) is connected to the second layer (MT2) using vias.

14 Claims, 8 Drawing Sheets

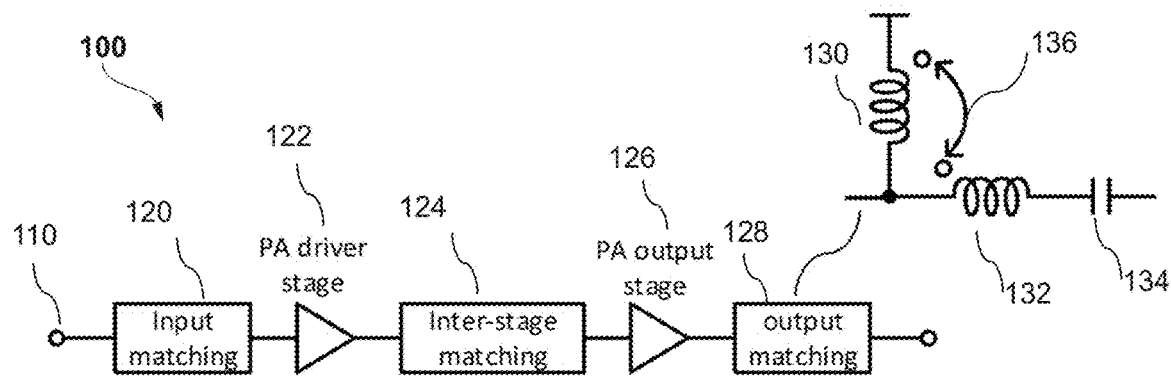
FIG. 1 – Prior Art
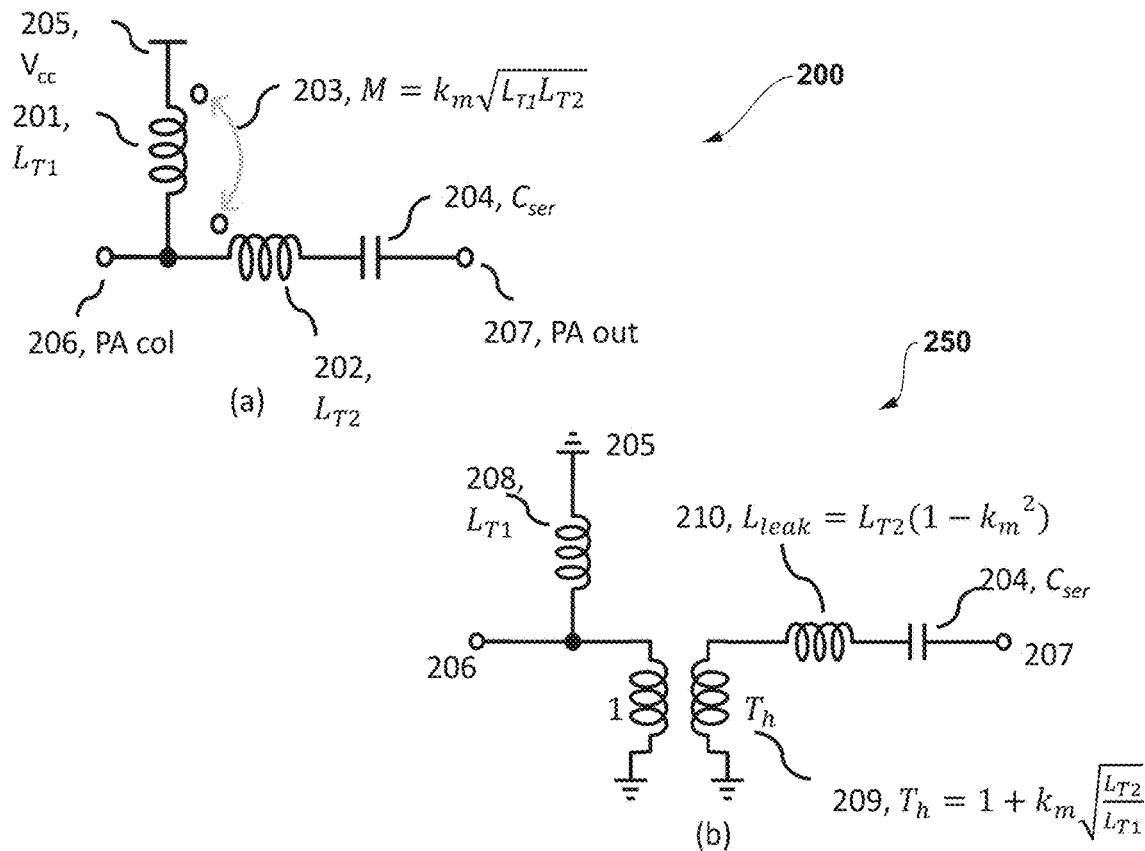
FIG. 2 – Prior Art

RADIO FREQUENCY AUTO-TRANSFORMER, RADIO FREQUENCY DEVICE AND METHOD OF CONSTRUCTION OF AN AUTO-TRANSFORMER

CROSS-REFERENCE TO RELATED APPLICATIONS

This application claims the priority under 35 U.S.C. § 119 of European Patent application no. 21161087.8, filed on 5 Mar. 2021, the contents of which are incorporated by reference herein.

FIELD OF THE INVENTION

The field of the invention relates to an auto-transformer, a radio frequency device having an auto-transformer and a method of construction of an auto-transformer. The invention is applicable to, but not limited to, a radio frequency coupling-enhanced auto-transformer circuit and layout.

BACKGROUND OF THE INVENTION

An auto-transformer is a single winding transformer that works on the principle of Faraday's Law of electromagnetic induction, and is primarily used in a low voltage range, for industrial, commercial and laboratory purposes. Since part of the winding performs a 'double duty' function, autotransformers have the advantages of often being smaller, lighter, and cheaper than typical dual-winding transformers, whilst incurring a disadvantage of not providing electrical isolation between primary and secondary circuits. Other advantages of autotransformers include lower leakage reactance, lower losses, lower excitation current, and increased voltage/amperage (VA) rating for a given size and mass.

In the field of radio frequency (RF) and microwave engineering, and particularly RF radio frequency devices, an auto-transformer has been increasingly used for output matching of RF circuits and devices, due to their size and inexpensive cost benefits. FIG. 1 shows a typical block diagram of a two-stage power amplifier (PA) design 100 of a radio frequency device that uses an auto-transformer for output matching. The 2-stage PA has an input 110 to an input matching circuit 120 to match (in an RF sense) the input impedance with a PA driver stage 122. The PA driver stage 122 may include an inter-stage matching network 124, to match the output of the PA driver stage 122 with a final PA output stage 126. The output of the final PA output stage 126 is input to an auto-transformer output matching network (OMN) 128. The auto-transformer output matching circuit 128 includes a shunt inductor (sometimes referred to as a coil) 130 connected between a supply voltage and the output signal path that includes a series inductor 132 and capacitor 134, coupling the signal to an antenna or antenna array (not shown). The combination of the shunt inductor 130 with the series inductor 132 forms a coupling 136.

Referring now to FIG. 2, a schematic circuit example of a classical auto-transformer 200, and an equivalent model 250 of the auto-transformer are illustrated. Such a classical auto-transformer in a PA OMN is described in US 2019334489 A1. The classical auto-transformer 200 is formed of a shunt inductor 201 (assume the inductance of the shunt inductor 201 to be $L_{T1}$), a series inductor 202 (assume inductance of the series inductor 202 to be $L_{T2}$), and a mutual inductor $M=k_m\sqrt{L_{T1}L_{T2}}$ from resulting inductive coupling between the shunt inductor 201 and series inductor 202. A series capacitor 204 is shown that is not part of the auto-transformer but is always used to block any dc signals or used to perform additional tuning to implement the PA OMN. The auto-transformer 200 is connected to supply Vcc port 205, PA collector 206, and PA output port 207, respectively. In the equivalent model 250 of the auto-transformer, the supply Vcc port 205 is treated as an ac ground connection. From the equivalent model 250 of the auto-transformer it can be seen that the shunt inductor 208 in the equivalent model 250 remains the same value as shunt inductor 201, at $L_{T1}$. The mutual (magnetic) coupling between shunt inductor 201 and series inductor 202 in the equivalent model 250 is converted to a transformer 209 and a series inductor 210. The transformer 209 has the impedance transformation ratio of:

$$1:T, \text{ and } T = 1 + k_m\sqrt{\frac{L_{T2}}{L_{T1}}}. \qquad [1]$$

The series inductor 210 has the leakage inductance of: $L_{leak}=L_{T2}(1-k_m^2)$. The series capacitor 204 is usually designed to resonate with the leakage inductance 210 at the operational frequency $$(f_c): C_{ser} = \frac{1}{(2\pi f_c)^2 \times L_{leak}}.$$

In practical PA designs, $L_{T1}$ is used to tune out the output capacitance of the PA, and T transforms the impedance from PA output port 207 (typically 50 Ohm) to the required PA loading impedance at the PA collector 206. U.S. Pat. No. 9,087,838 describes a structure and method for a high-k transformer that specifically only uses two capacitive and two inductive coupling paths in total, and therefore suffers from a limited impedance transformation capability vs bandwidth due to it being a regular transformer type. Additionally, the layout configuration of this U.S. Pat. No. 9,087,838 provides a limited inductive coupling factor. Improving the frequency bandwidth and reducing the insertion loss, whilst maintaining linearity and efficiency of the power amplifier (PA) always remains a key challenge to solve in RF designs, particularly in PA OMNs of wireless radio frequency devices.

SUMMARY OF THE INVENTION

The present invention provides an auto-transformer circuit, a radio frequency device, and a method of constructing a RF auto-transformer therefor, as described in the accompanying claims. Specific embodiments of the invention are set forth in the dependent claims. These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 illustrates a simplified known drawing of a radio frequency (RF) radio frequency device with an auto-transformer circuit applied in a PA output matching network.

FIG. 2 illustrates a schematic circuit example of: (a) a classical auto-transformer and (b) an equivalent model.

DETAILED DESCRIPTION

Figure 3:
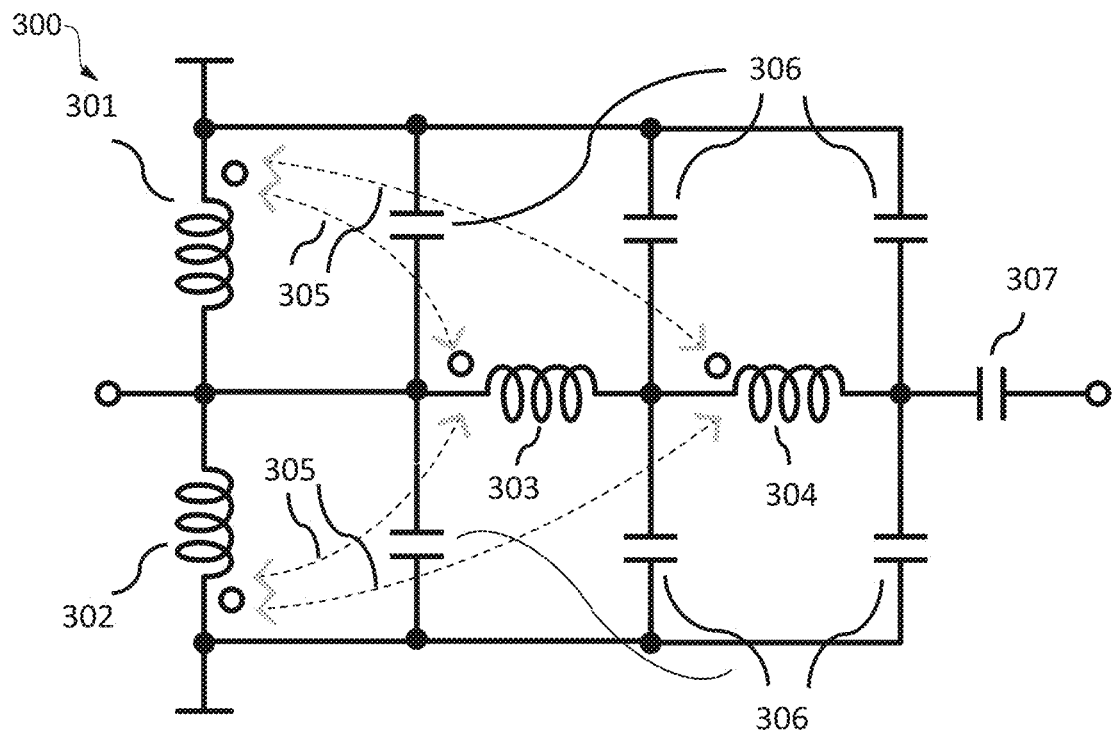
FIG. 3 illustrates one example of a schematic of a coupling-enhanced auto-transformer, according to example embodiments of the invention.

Examples of the present invention introduce an inductive and capacitive coupling enhancement technique, both in terms of schematic and layout implementation that provides a coupling-enhanced auto-transformer that achieves a wide-band, low-insertion loss performance. In some examples, the coupling-enhanced auto-transformer may be used in a PA OMN. In some examples, the embodiments described herein may be particularly useful for a wide-band, high-linearity and high-efficiency PA design.

Briefly referring back to the known auto-transformer design 200 and model 250 in FIG. 2, the inventors have recognized and appreciated that, for the same impedance transformation ratio, increasingly the inductive coupling $k_m$ can decrease the leakage inductance of $L_{T2}$, which effectively reduces the effect of the parasitic resistance of the $L_{T2}$ and improves the insertion loss. Thus, the inventors have recognized and appreciated that increasing the inductive coupling $k_m$ can effectively improve insertion loss of an auto-transformer design. Examples of the invention illustrate how this increase in the inductive coupling can be achieved through use of a novel, coupling-enhanced, auto-transformer layout. In addition, the inventors have recognized and appreciated that increasing $k_m$ also decreases the leakage inductance 210, which improves the frequency bandwidth of a series LC resonator, such as leakage inductor 210, where the leakage is identified in equation [2] below, and series capacitor 204 of FIG. 2. In this manner, a design can be developed to enable the whole matching network to also be more wideband in nature.

$$L_{leak}=L_{T2}(1-k_m^2) \quad [2]$$

Examples of the present invention describe an auto-transformer that includes two parallel shunt inductors interwound with two series inductors. In terms of layout implementation, the layer crossing and routing is arranged in such a way that the shunt and series inductors are closer and in physical space stronger coupled to each other. As a result, the auto-transformer has a very high coupling-factor, resulting in low insertion loss and wide-band operation. This increase in inductive coupling, $k_m$, with re-configured layer crossing and routing enables wide-band and high performance RF and microwave circuit designs. In some examples, the coupling-enhanced, auto-transformer layout may be achieved with a monolithically integrated auto-transformer, which may be implemented in a RF integrated circuit (RFIC).

In a first aspect of the invention, examples of the present invention provide a radio frequency (coupling-enhanced) auto-transformer circuit and layout that comprises an inner coil formed with a first metal layer to create a first shunt inductor, wherein at least a portion of the inner coil is overlayed with a second metal layer that creates a first series inductor that exhibits inductive coupling to the first shunt inductor. An outer coil is formed with the first metal layer that creates a second series inductor, where the outer coil is located adjacent the inner coil and provides inductive coupling between the second series inductor and each of the first shunt inductor and first series inductor. At least a portion of the outer coil is overlayed with the second metal layer that creates a second shunt inductor that exhibits inductive coupling between the second shunt inductor and each of the first shunt inductor and first series inductor and second series inductor. The outer coil is connected to the inner coil and the respective first metal layer are connected to the second layer using vias. In some examples of the invention, the auto-transformer may be configured with one central point where all the windings come together. In this manner, the overlaying and adjacent locating of inner/outer coils enables an increased electromagnetic coupling to be achieved, thereby providing a coupling-enhanced auto-transformer that achieves a wide-band, low-insertion loss performance.

Figure 8:
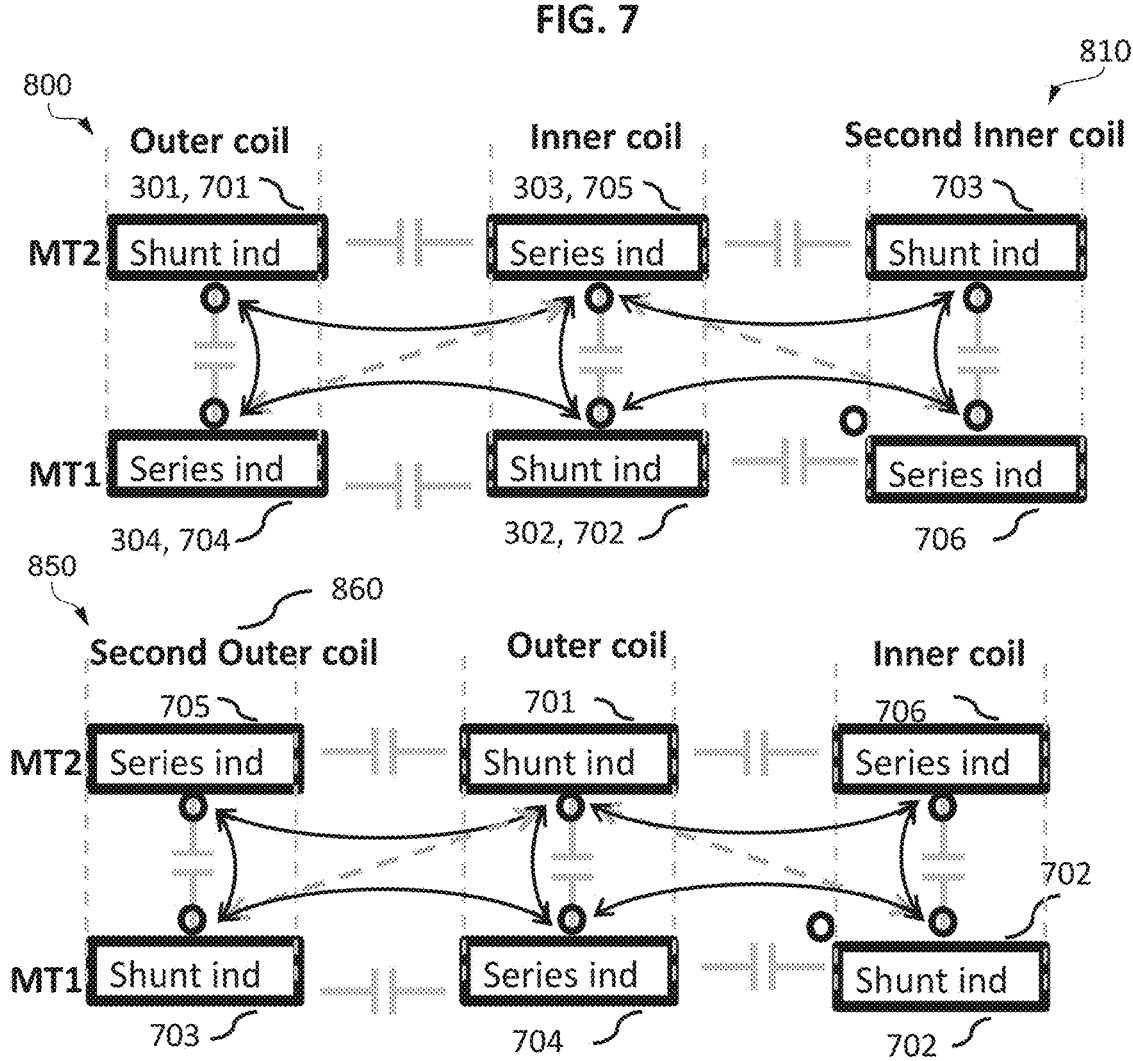
FIG. 8 illustrates an example corresponding layout cross section of the alternative coupling-enhanced auto-transformer of FIG. 7, according to example embodiments of the invention.

In examples of the invention, the term 'adjacent' with regard to the location of the outer coil with respect to the inner coil is intended to encompass as close a physical distance as the minimum metal spacing allows in the metal back-end technology, but within range to still achieve the desired inductive coupling at the frequency of operation. In some examples of the invention, the term 'electromagnetic coupling' is intended to encompass any inductive or capacitive coupling arrangement with a coupling factor of 0.5 or greater. In examples of the invention, a coupling factor of 0.8 or higher can be readily achieved. In some examples of the invention, a portion of the inner coil/outer coil is overlayed with the opposite metal layer. In some examples of the invention, the 'portion' may approach 100% of overlay. In some examples of the invention, it is envisaged that the 'portion' may be 50% of overlay, or as shown in FIG. 8, a 75% overlay of the inner coil/outer coil with the opposite metal layer can achieve the desired coupling.

Furthermore, in some examples, the inner coil and the outer coil may be formed in a substantially octagonal shape. In this manner, a more compact design for the auto-transformer circuit and layout can be achieved. In addition, in some examples, the auto-transformer circuit and layout may include a shunt input inductor-capacitor, LC, resonator circuit being formed and located within the inner coil. In some examples, the shunt input LC resonator circuit located within the inner coil is formed in a figure-8 arrangement. In this manner, an input matching circuit can be included within the auto-transformer circuit and layout in a more compact design. In some examples, the two-shunt inductors and two series inductors can be extended to multiple inductors in an alternating shunt-series-shunt-series design per layer, according to the prevailing performance requirements and/or space constraints.

In a second aspect of the invention, a radio frequency device comprising the RF auto-transformer circuit of the first aspect is described. In a third aspect of the invention, a method of constructing a RF auto-transformer is described. The method comprises: forming an inner coil with a first metal layer to create a first shunt inductor, wherein at least a portion of the inner coil is overlayed with a second metal layer that creates a first series inductor that exhibits inductive coupling to the first shunt inductor; forming an outer coil with the first metal layer that creates a second series inductor, where the outer coil is located adjacent the inner coil and provides inductive coupling between the second series inductor and each of the first shunt inductor and first series inductor. The method further comprises overlaying at least a portion of the outer coil with the second metal layer that creates a second shunt inductor that exhibits inductive coupling between the first shunt inductor and each of the first shunt inductor and first series inductor and second series inductor; and connecting the outer coil to the inner coil and the first metal layer to the second layer using vias.

Referring now to FIG. 3, one example of a schematic of a coupling-enhanced auto-transformer 300 is illustrated, according to example embodiments of the invention. In practice, some examples of the invention utilise two thick metal layers to implement one or more of the concepts herein described; a bottom thick metal layer (MT1) and a top thick metal layer (MT2). In a broad context encompassing some applications and some fabrication technologies, the term 'thick' as herein described depends on the particular fabrication or technology, but can often be in a range of 1-5 um depth. Thin metals are usually <1 um depth. In contrast, as known to those skilled in the art, in bulk CMOS nodes thin metal layers are used to interconnect all the logic gates together. RF processes usually add on top of that two or three thick metal layers.

As illustrated, the shunt inductor 201 of the known approach in FIG. 2 is separated in FIG. 3 into two inductors a first shunt inductor 301 and a second shunt inductor 302. In terms of layout, in a first example, first shunt inductor 301 may be implemented by an (MT2) outer coil and second shunt inductor 302 may be implemented by an (MT1) inner coil, as will be illustrated later.

Similarly, the series inductor 202 of the known approach in FIG. 2 is separated in FIG. 3 into two series inductors a first series inductor 303 and a second series inductor 304. In terms of layout, in a first example, first series inductor 303 may be implemented by a MT2 inner coil and second series inductor 304 may be implemented by MT1 outer coil, as will be illustrated later.

The inductive coupling between first shunt inductor 301 and first series inductor 303 and the second series inductor 304, as well as between the second shunt inductor 302 and the first series inductor 303 and second series inductor 304 are drawn in hashed lines, with the same label 305. Compared to the classical case with only one inductive coupling path (in FIG. 2), this arrangement provides four coupling paths, and thereby enhances the overall coupling inductive coupling $k_m$.

Figure 6:
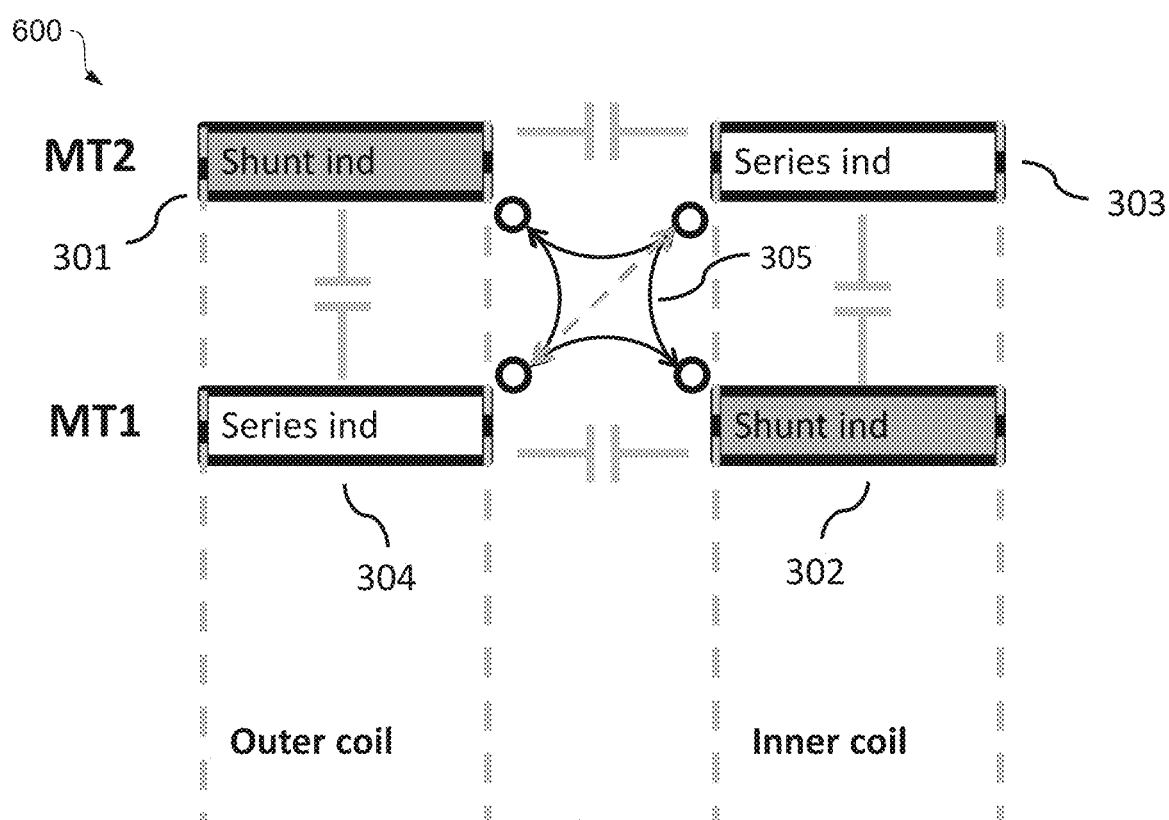
FIG. 6 illustrates one example of a cross-section of a coupling-enhanced auto-transformer, according to example embodiments of the invention.

In this example, capacitive coupling 306 is also introduced between the signal path on the inputs and outputs of the first series inductor 303 and second series inductor 304 and Vcc (ac ground). There is no capacitive coupling between the two shunt inductors 301 and 302, since they have the same electric potential. A small amount of coupling exists between the two series inductors 303 and 304, as illustrated with a dashed line in FIG. 6. The most important coupling provided by the concepts herein described is the strong inductive coupling 305 between the respective series and shunt inductors. Additionally, in this example new layout, the capacitive coupling between the shunt and series inductors are modelled as these distributed shunt capacitors 306. The distributed shunt capacitors 306 and series leakage inductors 303, 304 form a transmission line. Strong capacitive coupling (via large distributed shunt capacitors) decreases the characteristic impedance of transmission line and helps to further increase the bandwidth of auto-transformer. The output of the coupling-enhanced auto-transformer 300 is also connected to a series capacitor 307. Various instantiations of the example new layouts are illustrated in FIGS. 4-6.

Figure 4:
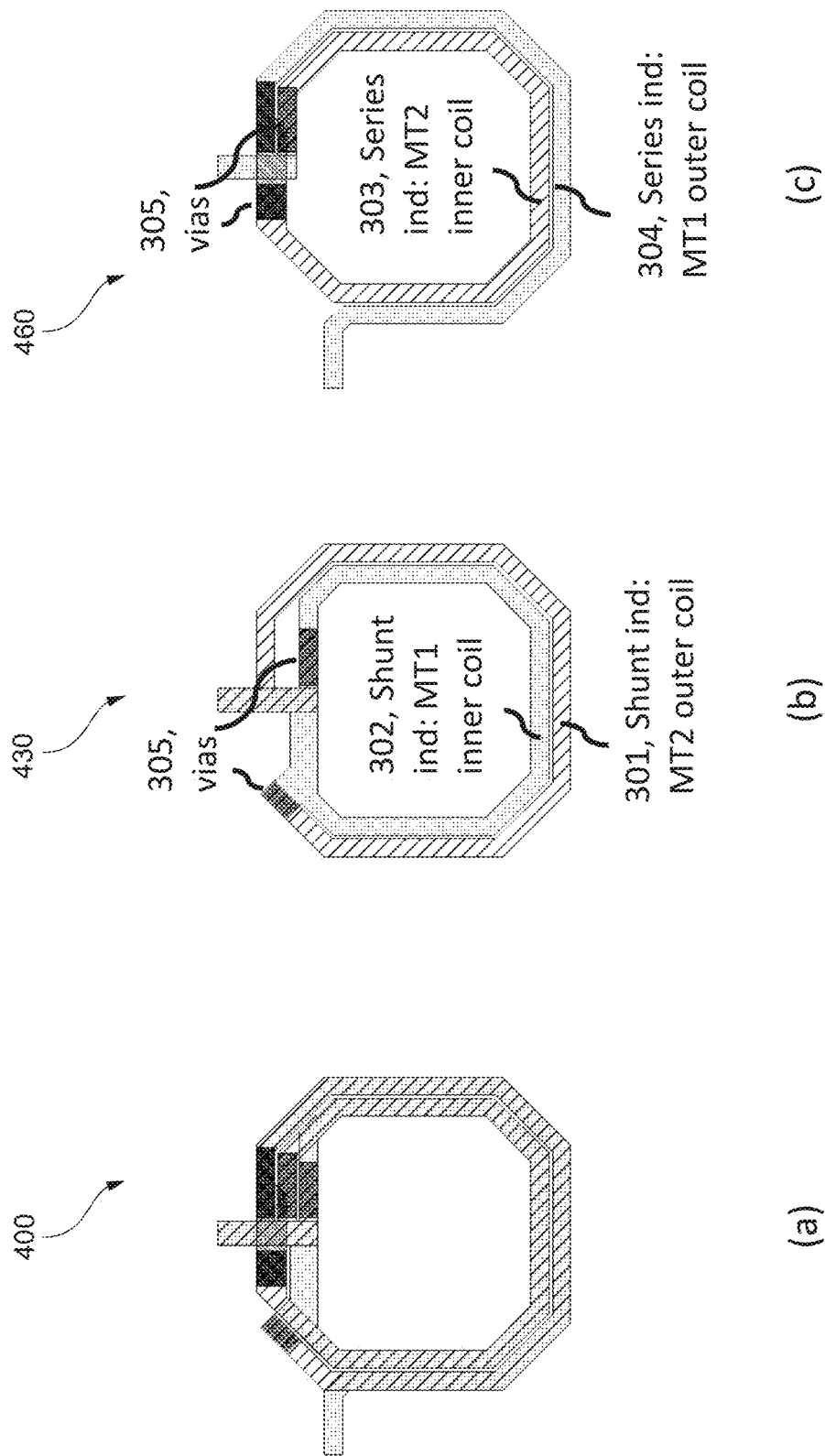
FIG. 4 illustrates one example of a layout of: (a) the coupling-enhanced auto-transformer, (b) shunt inductors in the auto-transformer, (c) series inductors in the auto-transformer of FIG. 3, according to example embodiments of the invention.
Figure 5:
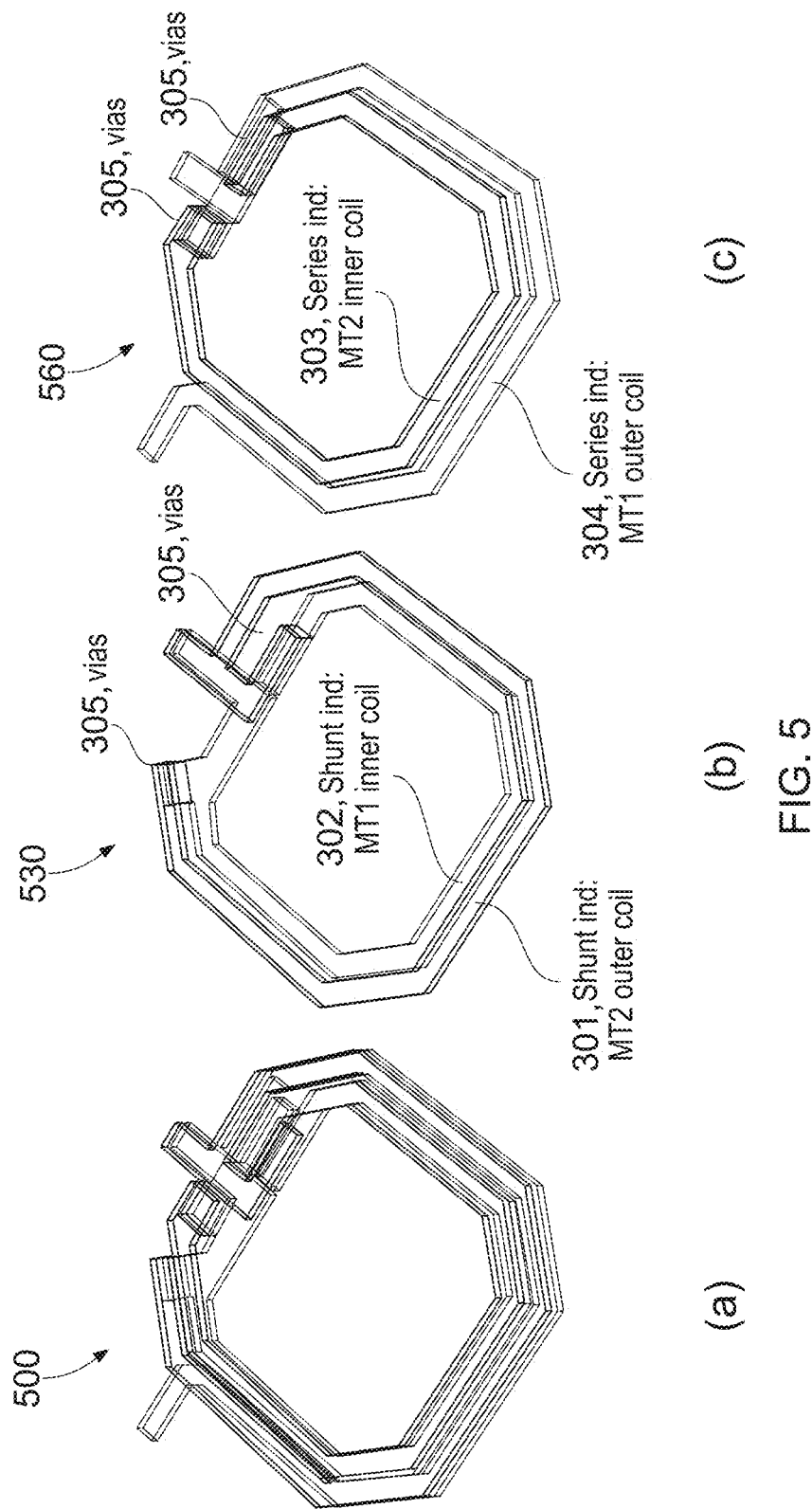
FIG. 5 illustrates further example implementations of 3D layout views of: (a) a coupling-enhanced auto-transformer, (b) shunt inductors in the auto-transformer, (c) series inductors in the auto-transformer of FIG. 3 and FIG. 4, according to example embodiments of the invention.

Referring now to FIG. 4, various examples of layouts 400, 430, 460 are illustrated, in accordance with example embodiments of the invention. A first 'top view' example layout 400 illustrates one example of the whole coupling-enhanced auto-transformer of FIG. 3, according to some example embodiments of the invention, and contains two shunt inductors and two series inductors. A second example layout 430 illustrates one example of shunt inductors: a first shunt inductor 302 in a top inner thick metal layer (MT2) and second shunt inductor 303 in a bottom outer thick metal layer (MT1) of a coupling-enhanced auto-transformer of FIG. 3, according to some example embodiments of the invention. A third example layout 460 illustrates one example of series inductors: a first series inductor 304 in a bottom inner thick metal layer (MT1) and a second series inductor 303 in a top outer thick metal layer (MT2) coupling-enhanced auto-transformer of FIG. 3, according to some example embodiments of the invention.

The hashed areas refer to the top thick metal layer (MT2), and the lighter dotted areas refer to the bottom thick metal layer (MT1).

In this manner, as shown, the layout arrangement of the coupling-enhanced auto-transformer is such that the first shunt inductor 301 is placed substantially above second series inductor 304 and is adjacent first series inductor 303. In this manner, inductive coupling is introduced between first shunt inductor 301 and second series inductor 304; and inductive coupling is also introduced between first shunt inductor 301 and first series inductor 303. Similarly, the layout arrangement of the coupling-enhanced auto-transformer is such that second shunt inductor 302 is located substantially below first series inductor 303 and is adjacent to second series inductor 304. In this manner, inductive coupling is introduced between second shunt inductor 302 and first series inductor 303; and inductive coupling is also introduced between second shunt inductor 302 and second series inductor 304. Thus, in this example, four inductive coupling paths are enabled to the circuit in FIG. 3.

In the illustrated example, the two shunt coils are implemented by MT2 outer coil 301 and MT1 inner coil 302; and the two series coils are implemented by MT2 inner coil 303 and MT1 outer coil 304. In another example, the configuration can be inverted and perform equally well, where the two shunt coils may be implemented by MT2 inner coil 303 and MT1 outer coil 304; and the two series coils may be implemented by MT2 outer coil 301 and MT1 inner coil 302.

For completeness, via connections 305 are located between and connect the MT1 and MT2 layers (shown in black).

Referring now to FIG. 5, further example implementations of 3D layout views 500, 530, 560 are illustrated, in accordance with example embodiments of the invention. A first example 'top view' 3D layout 500 illustrates one 3D example of the whole coupling-enhanced auto-transformer of FIG. 3, according to some example embodiments of the invention, and contains two shunt inductors and two series inductors. A second example 3D layout 530 better illustrates one example of shunt inductors: a first shunt inductor 302 in a top inner thick metal layer (MT2) and second shunt inductor 303 in a bottom outer thick metal layer (MT1) of a coupling-enhanced auto-transformer of FIG. 3, according to some example embodiments of the invention. A third example 3D layout 560 illustrates one example of series inductors: a first series inductor 304 in a bottom inner thick metal layer (MT1) and a second series inductor 303 in a top outer thick metal layer (MT2) coupling-enhanced auto-transformer of FIG. 3, according to some example embodiments of the invention.

In order to distinguish the coil with MT1 (lower) or MT2 (higher) metal layers, the boundary of MT2 layer is identified in black, and the boundary of MT1 layer is identified with light grey.

Referring now to FIG. 6, one example of a cross-sectional view 600 of the coupling-enhanced auto-transformer of FIG. 3 is illustrated, according to example embodiments of the invention. The cross-sectional view 600 further builds the relationship between the schematic circuit in FIG. 3 and layout implementation in FIG. 4 and FIG. 5, and clearly visualize the paths of inductive coupling and capacitive coupling. In this example, the traces of the shunt inductors 301, 302 are connected in parallel, so basically have the same potential and therefore have no capacitive or inductive coupling in between. The series inductances 303, 304 have negligible self-capacitive coupling and weak inductive coupling (the grey dotted line).

As shown, the inductive coupling and capacitive coupling are located between the adjacent series and shunt inductors, notably both in a vertical and a horizontal direction. The four black solid lines with arrows in the central area refer to the four inductive coupling paths 305. The traces of the shunt inductors 301, 302 are connected in parallel, so that they have the same potential and therefore have no capacitive or inductive coupling in between, which provides a significant coupling advantage over the known art. The capacitive coupling between the shunt inductors 301, 302 will decrease the self-resonant frequency of the inductors, and limit the frequency bandwidth of the auto-transformer. The capacitive coupling paths between the shunt and series inductors are drawn in grey capacitors in FIG. 6, which are modelled as the distributed shunt capacitors 306 in FIG. 3. As explained in FIG. 3, this enhanced capacitive coupling can further improve the frequency bandwidth of auto-transformer.

Figure 7:
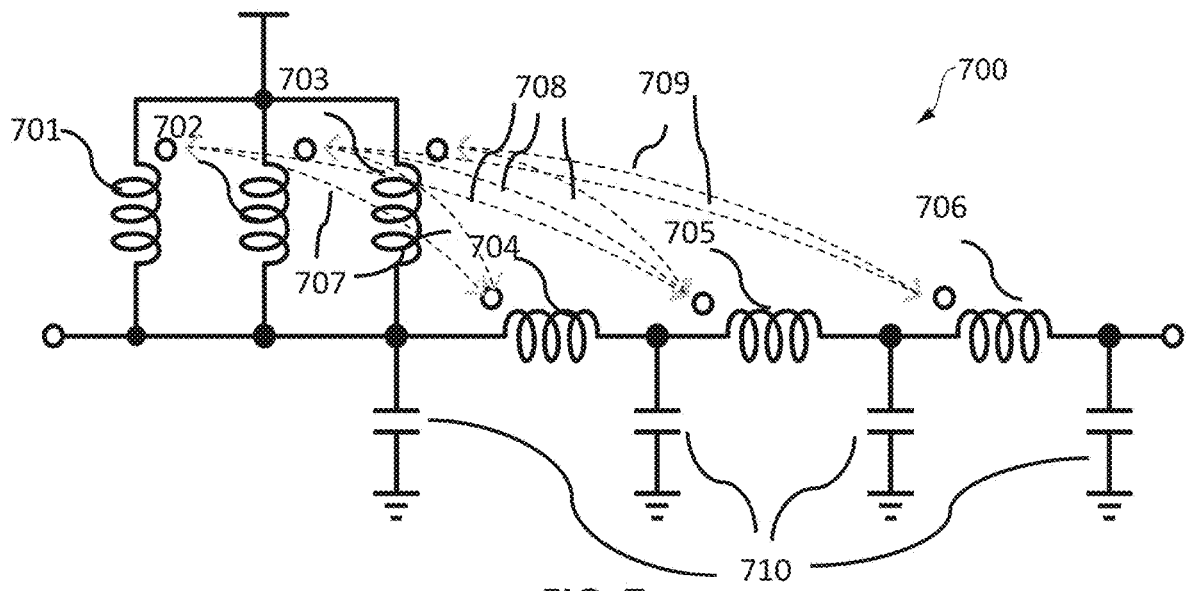
FIG. 7 illustrates one schematic example of an alternative coupling-enhanced auto-transformer, according to alternative example embodiments of the invention.

Referring now to FIG. 7, one schematic example of an alternative coupling-enhanced auto-transformer 700 is illustrated, according to example embodiments of the invention. Although the alternative coupling-enhanced auto-transformer 700 of FIG. 7 illustrates a circuit with three shunt inductors and three series inductors, it is envisaged that the concepts herein described may be implemented with any number of shunt inductors and series inductors within the two (top and bottom metal) layers. Although examples of the invention have been described with respect to configurations with two metal layers, it is envisaged that the concepts herein described will work equally well with three or more thick metal layers, for example RF processes often have two or three thick metal layers and can therefore benefit from the concepts described.

Again, in practice, some examples of the invention utilise two thick metal layers to implement one or more of the concepts herein described; a bottom thick metal layer (MT1) and a top thick metal layer (MT2). In this example, as illustrated, the shunt inductor 201 of the known approach in FIG. 2 is separated in FIG. 7 into three inductors a first shunt inductor 701, a second shunt inductor 702 and a third shunt inductor 703. In terms of layout, in a first example, first shunt inductor 701 may be implemented by a top layer MT2 outer coil and second shunt inductor 702 may be implemented by a bottom layer MT1 inner coil, and third shunt inductor 703 may be implemented by a top layer MT2 outer coil as will be illustrated later.

Similarly, the series inductor 202 of the known approach in FIG. 2 is separated in FIG. 7 into three inductors including a first series inductor 704 and a second series inductor 705 and a third series inductor 706. In terms of layout, in a first alternative example, first series inductor 704 may be implemented by a top layer MT2 inner coil, second series inductor 705 may be implemented by a bottom layer MT1 outer coil and third series inductor 706 may also be implemented by a top layer MT2 inner coil, as will be illustrated later.

The inductive coupling between first shunt inductor 701 and first series inductor 704, second series inductor 705 and third series inductor 706, as well as second shunt inductor 702 and each of the first series inductor 706, second series inductor 705 and third series inductor 706 are drawn in hashed lines, with the label 707, 708, 709 respectively. Similarly, inductive coupling is illustrated between third shunt inductor 703 and first series inductor 704, second series inductor 705 and third series inductor 706, Compared to the classical case with only one inductive coupling path (in FIG. 2), this arrangement provides seven coupling paths, and thereby enhances the overall coupling inductive coupling $k_m$. For confirmation, there are seven coupling paths due to the fact that the shorter distance results in a stronger coupling factor. Thus, the major coupling paths only exist for the adjacent coils. Hence, there is negligible coupling between the third shunt inductor 703 and first series inductor 704.

In this example, capacitive coupling 710 is also introduced between the signal path on the inputs and outputs of the first series inductor 704 and second series inductor 705 and third series inductor 706 and Vcc (ac ground). Additionally, in this example new layout, these distributed shunt capacitors 710 help to further decrease the series leakage inductance and increase the bandwidth of auto-transformer. The output of the coupling-enhanced auto-transformer 700 is also connected to a series capacitor (not shown).

Referring now to FIG. 8 one example of a cross-sectional view 800 of the alternative coupling-enhanced auto-transformer of FIG. 7 is illustrated, according to example embodiments of the invention. The cross-sectional view 800 further builds the relationship between the schematic circuit in FIG. 7 and a corresponding layout implementation (in a similar manner as the circuit of FIG. 3 may be implemented by the topology of FIG. 4 and FIG. 5), and clearly visualizes the paths of inductive coupling and capacitive coupling. In this example, the traces of the shunt inductors 701, 702 and 703 are connected in parallel, so basically have the same potential and therefore have no capacitive or inductive coupling in between. The series inductances 704, 705 and 706 have negligible self-capacitive coupling and weak inductive coupling (the grey dotted line). As shown, in this first example, a second inner coil 810 may be included that is adjacent the (first) inner coil and substantially replicates the outer coil, thereby providing an alternating relationship between the series inductor and shunt inductor in both the first metal layer (MT1) and the second metal layer (MT2) respectively, and then alternating.

FIG. 8 also illustrates a further example of a cross-sectional view 850 of the alternative coupling-enhanced auto-transformer of FIG. 7 is illustrated, according to example embodiments of the invention. As shown, in this further example, a second outer coil 860 may be included that is adjacent the (first) outer coil and substantially replicates the inner coil, thereby also providing an alternating relationship between the series inductor and shunt inductor in both the first metal layer (MT1) and the second metal layer (MT2). In this manner, any number of shunt inductors and series inductors can be included, with further inner coils and/or outer coils added as appropriate to the application.

Figure 9:
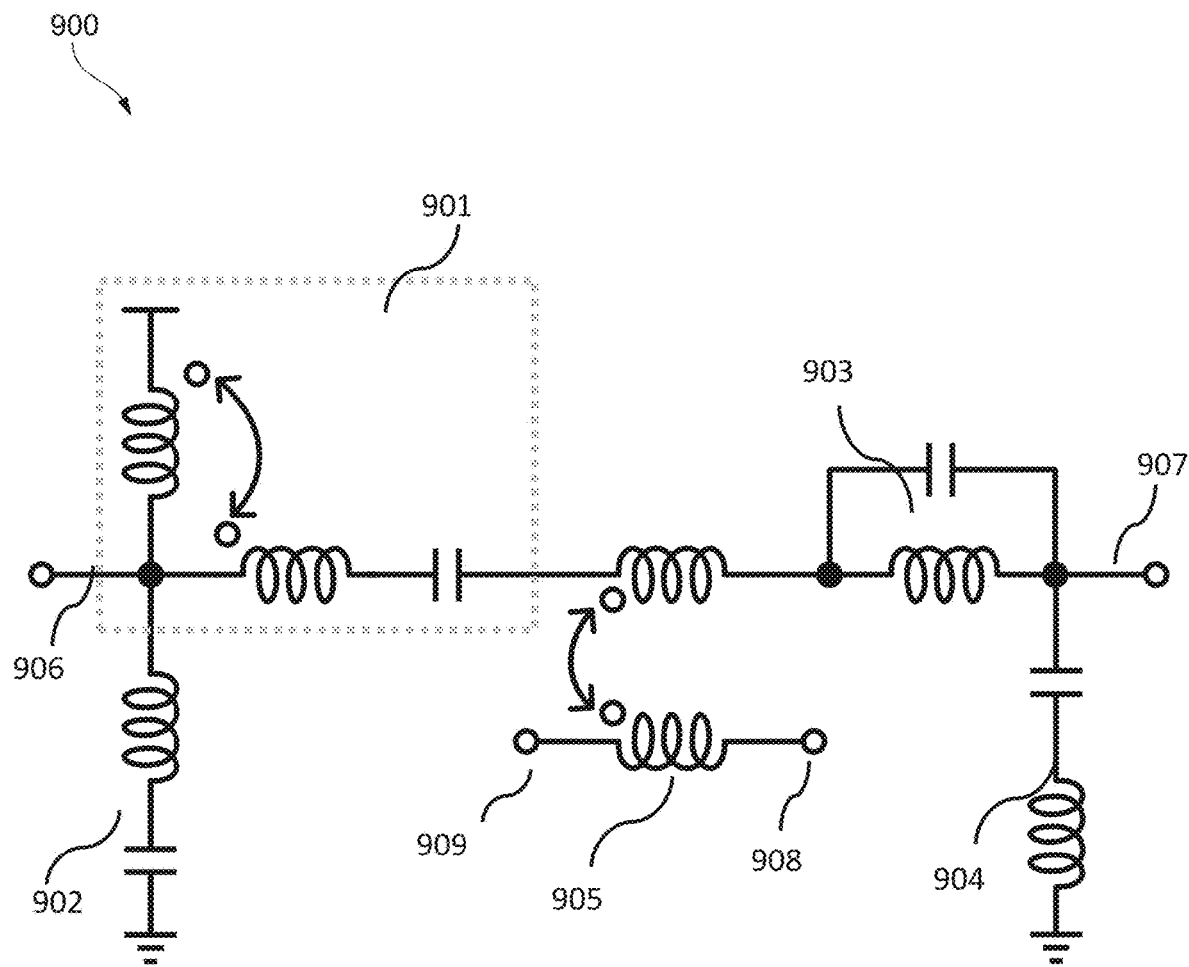
FIG. 9 illustrates one example of a PA OMN design with a coupling-enhanced auto-transformer, together with coupler and inductor-capacitor (LC) resonators, according to example embodiments of the invention.

Referring now to FIG. 9, one example of a PA OMN design 900 with a coupling-enhanced auto-transformers 901, together with coupler and inductor-capacitor (LC) resonators 902, 903, 904 is illustrated, according to example embodiments of the invention. In this example, the PA OMN may include the previously described coupling-enhanced, auto-transformer 901 and several LC resonators 902, 903 and 904, and a directional coupler 905.

In this example PA OMN design 900, a first input port 906 connects to the PA collector (not shown), a first output port 907 connects to the PA output, and a directional coupler 905 connects to a coupler isolated termination 908 and a coupler output 909. In this example PA OMN design 900, first (input shunt) LC resonator circuit 902 may be located within the hexagon-shaped coupling-enhanced auto-transformers 901 and configured to provide a $2^{nd}$ harmonic short at the collector of the PA, in order to improve linearity (say, in terms of error vector magnitude (EVM)). In this example PA OMN design 900, second (output series) LC resonator circuit 903 may be configured to provide a $2^{nd}$ harmonic open-circuit at the RF signal path. In this example PA OMN design 900, third (output shunt) LC resonator circuit 904 may be configured to provide a $2^{nd}$ harmonic short-circuit at the RF signal path. In this manner, in this example PA OMN design 900, the combination of second (output series) LC resonator circuit 903 and third (output shunt) LC resonator circuit 904 may be used to suppress the $2^{nd}$ harmonic (undesired) RF signal. Meanwhile, in this example, second (output series) LC resonator circuit 903 serves as a series inductor at a fundamental frequency, and third (output shunt) LC resonator circuit 904 serves as a shunt capacitor at this fundamental frequency. Thus, in this manner and in this example, the combination of second (output series) LC resonator circuit 903 and third (output shunt) LC resonator circuit 904 may also be configured to assist in the impedance transformation for the PA OMN.

Figure 10:
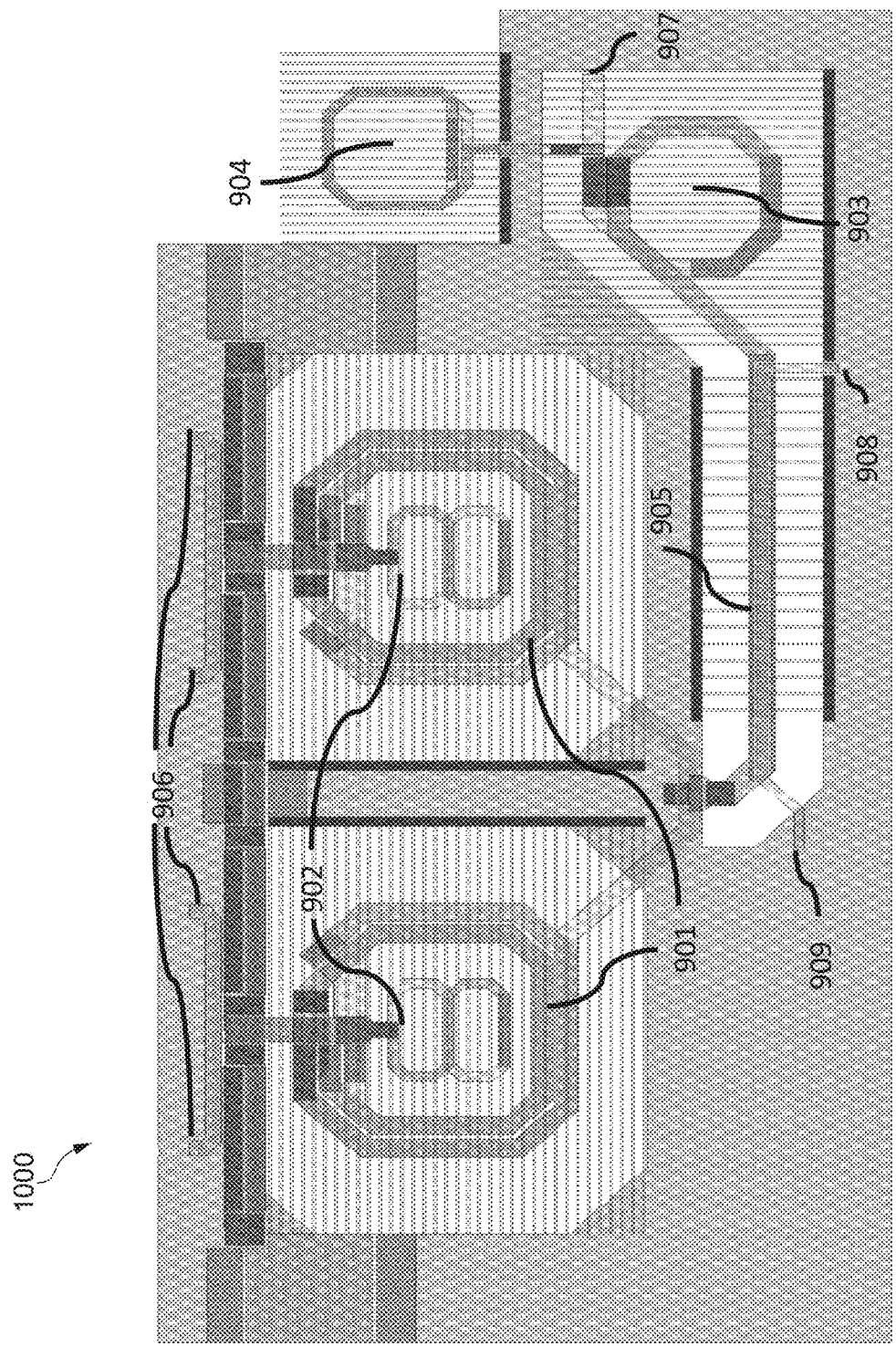
FIG. 10 illustrates one example of a corresponding layout of the PA OMN in FIG. 9, according to example embodiments of the invention.

Referring now to FIG. 10, one example of a corresponding layout 1000 of a PA OMN in FIG. 9 is illustrated, according to some example embodiments of the invention. In this example, since the PA output power is high, the PA collector port 906 is split into four output PA ports in parallel. In this example, the coupling-enhanced auto-transformer 901 and the first (input shunt) LC resonator circuit 902 configured to provide a $2^{nd}$ harmonic short at the collector of PA in order to improve linearity (EVM) are split into two parallel branches for power combining.

In this example, a figure-8-shaped inductor may be implemented in order to localize the magnetic field and reduce any inductive cross-talk to other inductors. Furthermore, a figure-8-shaped inductor may be used to realize the inductor in the first (input shunt) LC resonator circuit 902 that is configured to provide the $2^{nd}$ harmonic short notch, within the coupling-enhanced auto-transformer 901. In addition, as the illustrated coupling-enhanced auto-transformer 901 enhances the inductive coupling between the shunt inductors and series inductors inside coupling-enhanced auto-transformer 901, there is less magnetic field leakage. Thus, in this manner, there is good isolation between the auto-transformer 901 and the first (input shunt) LC resonator circuit 902 that is configured to provide the $2^{nd}$ harmonic short notch. As a result, the circuit layout 1000 is able to be very compact whilst maintaining a high Q-factor of the PA OMN and the absence of inductive coupling should not deteriorate the autotransformer performance.

Here, in this example 'real' power amplifier (PA) implementation that uses two parallel connected autotransformers that combine four PA core cells, four input ports 906 respectively connect to four PA collectors (not shown) and a first output port 907 connects to the PA output (not shown). In this example PA OMN design 900, at the output, a second (output series) LC resonator circuit 903 may be included and configured to provide a $2^{nd}$ harmonic open at the RF signal path. In this example PA OMN design 900, also at the output, a third (output shunt) LC resonator circuit 904 may be configured to provide a $2^{nd}$ harmonic short at the RF signal path. In this manner, in this example PA OMN design 900, the combination of second (output series) LC resonator circuit 903 and third (output shunt) LC resonator circuit 904 may be used to suppress the $2^{nd}$ harmonic (undesired) RF signal.

Figure 11:
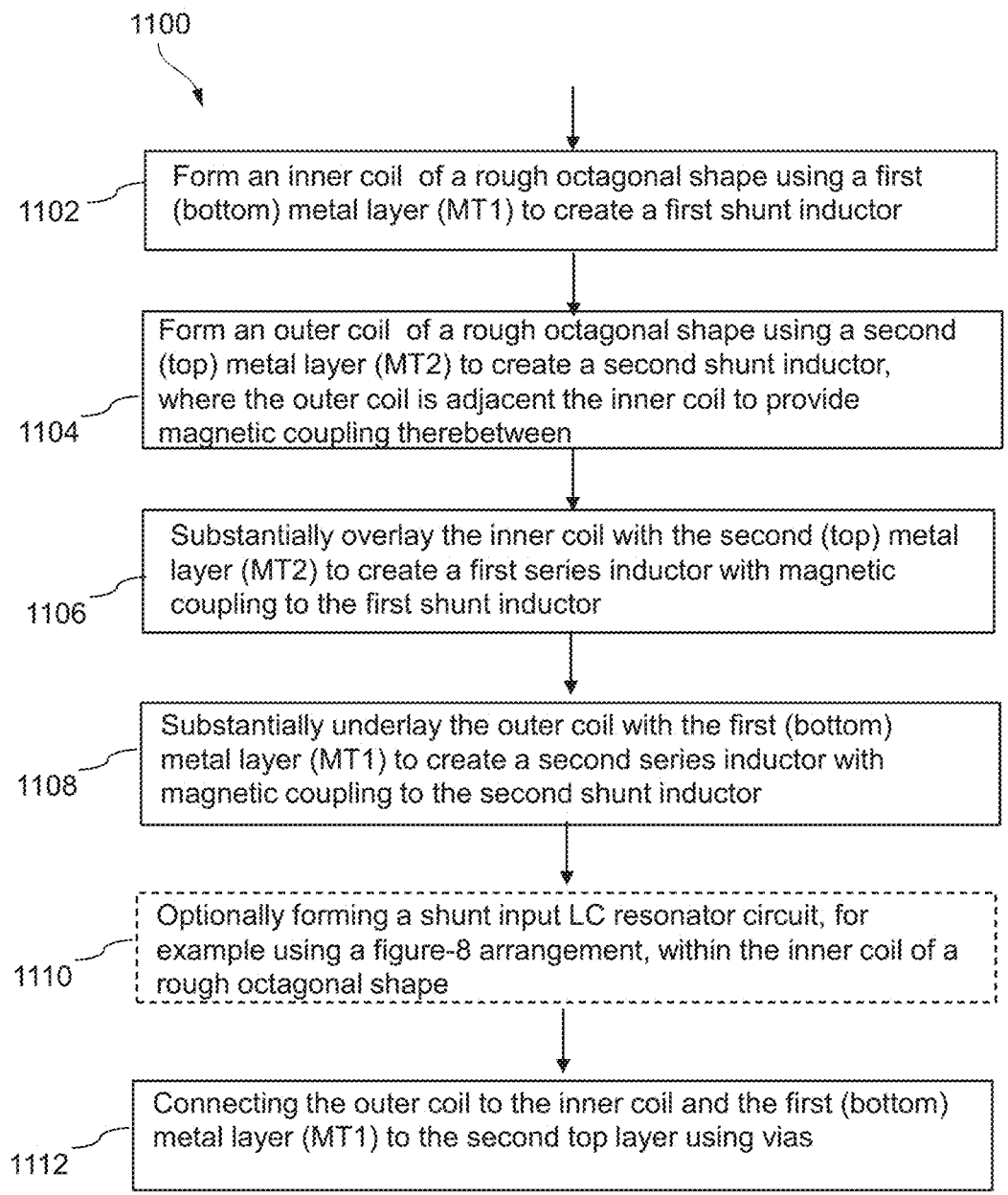
FIG. 11 illustrates one example of a flowchart of a method of constructing a coupling-enhanced auto-transformer, according to example embodiments of the invention.

Referring now to FIG. 11, one example of a flowchart 1100 of a method of constructing a coupling-enhanced auto-transformer is illustrated, according to example embodiments of the invention. The flowchart 1100 includes, at 1102, forming an inner coil of, say, a rough octagonal shape using a first (bottom) metal layer (MT1) to create a first shunt inductor. The flowchart 1000 further comprises, at 1104, forming an outer coil of, say, a similar rough octagonal shape using a second (top) metal layer (MT2) to create a second shunt inductor, where the outer coil is adjacent the inner coil in order to provide inductive coupling therebetween. At 1106, the flowchart includes substantially overlaying the inner coil using a further second (top) metal layer (MT2) to create a first series inductor with inductive coupling to the first shunt inductor. At 1108, the flowchart includes substantially underlaying the outer coil using the first (bottom) metal layer (MT1) to create a second series inductor with inductive coupling to the second shunt inductor. At 1110, the method further includes optionally forming a shunt input LC resonator circuit, for example using a figure-8 arrangement, within the inner coil of a rough octagonal shape. At 1112, the flowchart includes connecting the outer coil to the inner coil and the first (bottom) metal layer (MT1) to the second top layer (MT2) using vias.

Although examples have been described with respect to a coupling-enhanced auto-transformer circuit and layout design for a power amplifier, it is envisaged that the concepts herein described are equally applicable for other radio frequency applications, such as receiver front-end circuits. In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

In some examples, the circuits may be implemented using discrete components and circuits, whereas in other examples the circuit may be formed in integrated form in an integrated circuit for example using quarter wave (λ/4) transmission lines. Because the illustrated embodiments of the present invention may, for the most part, be implemented using electronic components and circuits known to those skilled in the art, details have not been explained in any greater extent than that considered necessary as illustrated below, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals. Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality. Furthermore, those skilled in the art will recognize that boundaries between the above-described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, the illustrated examples may be implemented as circuitry for the coupling-enhanced auto-transformer 300 of FIG. 3, the coupling-enhanced auto-transformer 700 of FIG. 7, and the coupling-enhanced auto-transformer 901 of FIG. 9 may be implemented on a single radio frequency integrated circuit (RFIC). Alternatively, the circuit and/or component examples may be implemented as any number of separate integrated circuits or separate devices interconnected with each other in a suitable manner. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radio frequency, RF, auto-transformer circuit comprising:
    an inner coil formed with a first metal layer to create a first shunt inductor, wherein at least a portion of the inner coil is overlayed with a second metal layer that creates a first series inductor that exhibits inductive coupling to the first shunt inductor;
    an outer coil formed with the first metal layer that creates a second series inductor, where the outer coil is located adjacent the inner coil and provides inductive coupling between the second series inductor and each of the first shunt inductor and first series inductor;
    wherein at least a portion of the outer coil is overlayed with the second metal layer that creates a second shunt inductor that exhibits inductive coupling between the second shunt inductor and each of the first shunt inductor and first series inductor and second series inductor,
    wherein the outer coil is connected to the inner coil and the respective first metal layer are connected to the second layer using vias; and
    wherein the first series inductor and the second series inductor are coupled together in series along a signal path, and the first shunt inductor and the second shunt inductor are each connected between the signal path and a supply port.

2. The RF auto-transformer circuit of claim 1 wherein overlaying at least a portion of the inner coil with the second metal layer (MT2) to create a first series inductor that exhibits inductive coupling to the first shunt inductor comprises overlaying a substantial portion that is 75% or greater of the inner coil with the second metal layer.

3. The RF auto-transformer circuit of claim 1 further comprising at least one second outer coil formed with the first metal layer that creates a third shunt inductor, wherein the at least one second outer coil is located adjacent the outer coil and provides inductive coupling between the third shunt inductor and each of the second shunt inductor and second series inductor; wherein at least a portion of the at least one second outer coil is overlayed with a second metal layer that creates a third series inductor that exhibits inductive coupling to each of the third shunt inductor, the second shunt inductor and second series inductor.

4. The RF auto-transformer circuit of claim 1 further comprising at least one second inner coil formed with the first metal layer that creates a fourth series inductor, wherein the at least one second inner coil is located adjacent the inner coil and provides inductive coupling between the fourth series inductor and each of the first shunt inductor and first series inductor; wherein at least a portion of the at least one second inner coil is overlayed with the second metal layer that creates a fourth shunt inductor that exhibits inductive coupling between the fourth shunt inductor and each of the first shunt inductor and first series inductor and fourth series inductor.

5. A radio frequency device comprising the RF auto-transformer circuit according to claim 1.

6. The RF auto-transformer circuit of claim 1 wherein the inner coil and the outer coil are formed in a substantially octagonal shape.

7. The RF auto-transformer circuit of claim 6 further comprising a shunt input inductor-capacitor, LC, resonator circuit being formed and located within the inner coil.

8. The RF auto-transformer circuit of claim 1 further comprising a shunt input inductor-capacitor, LC, resonator circuit being formed and located within the inner coil.

9. The RF auto-transformer circuit of claim 8 wherein the shunt input LC resonator circuit located within the inner coil is formed in a figure-8 arrangement.

10. The RF auto-transformer circuit of claim 8 further comprising at least one second outer coil formed with the first metal layer that creates a third shunt inductor, wherein the at least one second outer coil is located adjacent the outer coil and provides inductive coupling between the third shunt inductor and each of the second shunt inductor and second series inductor; wherein at least a portion of the at least one second outer coil is overlayed with a second metal layer that creates a third series inductor that exhibits inductive coupling to each of the third shunt inductor, the second shunt inductor and second series inductor.

11. The RF auto-transformer circuit of claim 8 further comprising at least one second inner coil formed with the first metal layer that creates a fourth series inductor, wherein the at least one second inner coil is located adjacent the inner coil and provides inductive coupling between the fourth series inductor and each of the first shunt inductor and first series inductor; wherein at least a portion of the at least one second inner coil is overlayed with the second metal layer that creates a fourth shunt inductor that exhibits inductive coupling between the fourth shunt inductor and each of the first shunt inductor and first series inductor and fourth series inductor.

12. A radio frequency device comprising the RF auto-transformer circuit according to claim 8.

13. A method of constructing a radio frequency, RF, auto-transformer, the method comprising:

forming an inner coil with a first metal layer to create a first shunt inductor, wherein at least a portion of the inner coil is overlayed with a second metal layer that creates a first series inductor that exhibits inductive coupling to the first shunt inductor;

forming an outer coil with the first metal layer that creates a second series inductor, where the outer coil is located adjacent the inner coil and provides inductive coupling between the second series inductor and each of the first shunt inductor and first series inductor;

overlaying at least a portion of the outer coil with the second metal layer that creates a second shunt inductor that exhibits inductive coupling between the first shunt inductor and each of the first shunt inductor and first series inductor and second series inductor; and connecting the outer coil to the inner coil and the first metal layer to the second layer using vias; and forming a shunt input LC resonator circuit located within the inner coil.

14. The method of constructing a RF auto-transformer of claim 13 wherein the shunt input LC resonator circuit located within the inner coil is formed in a figure-8 arrangement.

* * * * *